United States Patent [19]

Machida et al.

[11] Patent Number: 4,806,706

[45] Date of Patent: Feb. 21, 1989

[54] PRINTED WIRING BOARD

[75] Inventors: Hideo Machida; Shin Kawakami; Satoshi Haruyama; Hirotaka Okonogi; Katutomo Nikaido; Norito Mukai, all of Saitama, Japan

[73] Assignee: Nippon CMK Corp., Saitama, Japan

[21] Appl. No.: 112,095

[22] Filed: Oct. 21, 1987

[30] Foreign Application Priority Data

| Apr. 8, 1987 | [JP] | Japan | 62-86604 |
| Apr. 8, 1987 | [JP] | Japan | 62-86605 |
| Apr. 8, 1987 | [JP] | Japan | 62-86606 |
| Apr. 8, 1987 | [JP] | Japan | 62-86607 |
| Apr. 8, 1987 | [JP] | Japan | 62-86608 |
| Apr. 17, 1987 | [JP] | Japan | 62-96034 |
| Apr. 17, 1987 | [JP] | Japan | 62-96035 |
| Apr. 17, 1987 | [JP] | Japan | 62-96036 |
| Apr. 17, 1987 | [JP] | Japan | 62-96038 |

[51] Int. Cl.$^4$ .............................................. H05K 1/00
[52] U.S. Cl. .................................. 174/68.5; 228/180.1
[58] Field of Search ................... 114/68.5; 228/180.1

[56] References Cited

U.S. PATENT DOCUMENTS 4,389,771 6/1983 Cassidy et al. .................. 174/685 X
4,390,615 6/1983 Courtney et al. ............ 228/180.1 X

FOREIGN PATENT DOCUMENTS 2080629 2/1982 United Kingdom ............... 174/68.5

Primary Examiner—Morris H. Nimmo
Attorney, Agent, or Firm—Bruce L. Adams; Van C. Wilks

[57] ABSTRACT

A printed wiring board includes a dielectric base plate, a circuit pattern at least on one surface of the base plate, and a solder resist film containing silicon series and/or fluorine series and covering the base plate except a desired soldering area of the circuit pattern. The solder resist film has solder repelling property to prevent bridging of solder across adjacent circuits. However, the solder repelling property apts to form dots on the solder resist film. Accordingly, at least one flux accumulating portion is formed on said one surface of the base plate to accumulate flux repelled by the solder resist film. The flux accumulating portion may be a recess and/or through-hole arranged on the surface of the solder resist film.

16 Claims, 3 Drawing Sheets

PRINTED WIRING BOARD

BACKGROUND OF THE INVENTION

1. Technical Field

The present invention relates to a printed wiring or circuit board.

2. Description of the Prior Art

In general, a printed wiring board is formed with a necessary circuit pattern, on an insulated base plate, of electric conductor, and necessary electronic parts are assembled in the circuit pattern.

Assembling of the electronic parts is carried out such that, after the electronic parts are mounted on the printed wiring board, the circuit pattern surface of the printed wiring board is dipped in a melted solder bath or a jet stream solder bath to apply the solder to the circuit pattern surface to electrically and mechanically connect the circuit pattern with leads of the electronic parts.

To perform the soldering of the circuit pattern with the leads of the electronic parts, previously all the surface of the circuit pattern is covered by a solder-resist film except the land area to be soldered, to feed solder only to the necessary portion on the circuit pattern. As the circuit pattern is smaller, a distance between adjacent circuits is also narrower and distance between connection lands is narrower, to result in bridging between the lands by soldering, to impair the function of the solder-resist film. This results in repair operation afterwards.

To prevent the bridging of the solder, especially to prevent the bridging of solder between narrow distance land portions, an improved printed wiring board manufacturing process is disclosed such that, an electrically conductive pattern is printed on the insulated base plate, all of the surface of the conductive pattern is covered by a first layer of solder resist film except land portions to be soldered, and a second layer of bridge preventing solder resist film is covered on the first layer at least between narrow distance land portions to prevent bridging of solder. The process is disclosed in Japanese Patent Publication No. 41162/1979.

However, the process must be performed by forming the first solder resist layer, and forming the second bridge preventing solder resist layer. As the first resist layer covers all the surface of the conductive pattern except land portions to be soldered, highly accurate alignment is required to expose the land portions to be soldered. Further as the second bridge preventing solder resist layer is formed on the first solder resist layer after the first solder resist layer is formed, another highly accurate alignment is required, and also solder resist ink of screen printing type used to form solder resist layer tends to spread over the land portions to be soldered.

Accordingly, the applicant of the present invention filed Japanese Patent Application No. 37647/1987 in which is disclosed an improved printed wiring board effective to mitigate the above mentioned disadvantages of the known printed wiring board, the improved printed wiring board comprised of a solder-resist layer having necessary solder resist function without adding any complicated technical operations to the conventional solder resist covering operation.

More particularly, the solder resist film on the printed wiring board can positively prevent flux and solder from adhering on the surface due to characteristics of silicone and/or fluorine series resin contained in the film. Further, when the film is formed by solder resist printing ink on another surface of the base plate having a circuit pattern one one surface, invasion of flux or solder through through-holes or parts insert holes formed in the printed wiring board is also positively prevented.

FIG. 1 is an enlarged sectional view of a portion of the printed wiring board having the above described solder resist film. In the drawing, 1 designates an insulated base plate, 2 is a circuit patern formed of electrically conductive copper film on one surface 1a of the insulated base plate, 3 is a connection land in the circuit pattern 2, 4 is a through hole open at the connection land 3, 6 is a solder resist film coated on the surface of the circuit patern 2, and 7 is another solder resist film coated on the other surface 1b of the insulated base plate 1.

The solder resist film 6 covers all the surface of the circuit patern 2 except the connection land 3, and is formed 7 by means of, for example, silk screen printing process utilizing printing ink containing insulating silicone or fluorine series resin which can prevent flux or solder from adhering on the surface.

Examples of composition of the solder resist printing ink which is used to form the solder resist films 6 and 7 are as follows:

| Composition 1 | | |
|---|---|---|
| epoxy acrylate | 28 | wt. part |
| polyethylene glycol acrylate | 72 | |
| benzoin alkylether | 4 | |
| titanium dioxide | 5 | |
| silicon dioxide | 3 | |
| diphenyl disulfide | 2.0 | |
| pigment (cyaning green) | 0.4 | |
| diethyl hydroxy amin | 0.1 | |
| dimetyl siloxane (anti-foam agent) | 2.0 | |
| silicone series high polymer resin | 2–5 | |
| Composition 2 | | |
| epoxy acrylate | 28 | wt. part |
| polyethylene glycol acrylate | 72 | |
| benzoin alkylether | 4 | |
| titanium dioxide | 5 | |
| silicon dioxide | 3 | |
| diphenyl disulfide | 2.0 | |
| pigment (cyaning green) | 0.4 | |
| diethyl hydroxy amin | 0.1 | |
| dimetyl siloxane (anti-foam agent) | 2.0 | |
| fluorine series surface active agent (Florard FC-170C Sumitomo 3-M Co.) | 2–5 | |
| Composition 3 | | |
| epoxy acrylate | 50 | wt. part |
| polyuretane acrylate | 50 | |
| benzoin methylether | 4 | |
| calsium carbonate | 5 | |
| silicon dioxide | 3 | |
| cyaning green | 0.4 | |
| benzo thiazole | 0.05 | |
| benzo phenon | 2.6 | |
| dimethl siloxane | 1.5 | |
| silicon series high molecule resin | 2–5 | |
| Composition 4 | | |
| epoxy acrylate | 50 | wt. part |
| polyuretane acrylate | 50 | |
| benzoin methylether | 4 | |
| calsium carbonate | 5 | |
| silicon dioxide | 3 | |
| cyaning green | 0.4 | |
| benzo thiazole | 0.05 | |
| benzo phenon | 2.6 | |
| dimethl siloxane | 1.5 | |
| silicon series high molecule resin | 2–5 | |
| fluorine series surface active agent (Florard FC-430, Sumitomo 3-M Co.) | 2–5 | |

In the above mentioned compositions, substantial market-available examples of the silicon series and fluorine series resins are follows:

Silicon series resin

Shinetu Chemical Ind. Co. Ltd. Japan
 Polon L, Polon T, KF 96, KS-700, KS-701, KS-707, KS-705F, KS 706, KS-709, KS-709S, KA-711, KSX-712, KS-62F, KS-62M, KS-64, Silicolube G-430, Silicolube G-540, Silicolube G-541.
Tore Silicon Co. Ltd. Japan
 SH-200, SH-210, SH-1109, SH-3109, SH-3107, SH-8011, FS-1265, Syli-off 23, DC pan Glaze 620.

Fluorine series resin

Daikin Ind. Co. Ltd. Japan
 Dai-free MS-443, MS-543, MS-743, MS-043, ME-413, ME-810.
Sumitomo 3-M Co. Ltd. Japan
 Fulorard FC-93, FC-95, FC-98, FC-129, FC-134, FC-430, FC-431, FC-721.
Sumitomo Chemical Ind. Co. Ltd. Japan
 Sumi-fulunon FP-81, FP-81R, FP-82, FP-84C, FP-84R, FP-88.
Seibi Chemical Ind. Co. Ltd. Japan
 Surflon SR-100, SR-100X.

In the above described compositions, silicon series or fluorine series high molecular resin is selectively added. However, both of silicon series and fluorine series high molecular resins may be added, and the quantity is preferably within 2-5 wt. part, to attain desired effect. To increase the added quantity, economical problem may accompanies, however, the same functional effect may be expected.

Further, while the conventional solder resist ink has contact angle about 60-70 degree, the contact angle of the solder resist ink of the above described composition is more than 90 degree.

The printed wiring board of such construction has on both sides of the insulated base plate 1, solder resist films 6 and 7 which are formed by coating the printing ink containing the silicon and/or fluorine series resin. Thus, according to the characteristics of the silicon and fluorine series resin, flux or solder can not wet the film so that adhesion of the flux or solder outside the electric connection portions e.g. the connection land 3, is prevented positively. Consequently, bridging between adjacent lands caused by high density circuit pattern 2 can be prevented.

The solder resist films 6 and 7 can be formed by means of e.g. silk screen process which is similar with the conventional process to the conventional solder resist film so that it is very advantageous.

As the surface 1b of the insulated base plate 1 which has the circuit pattern 2 on one side surface 1a, also formed with the solder resist film 7 so that invasion of the flux or solder from the through hole 4 formed in the printed wiring board is effectively prevented.

In the above mentioned structure one surface 1a of the insulated base plate 1 is formed with the circuit pattern 2, but circuit patterns may be formed on both surfaces of the base plate 1. Further, the solder resist film 6 only may cover the circuit pattern 2 on one side surface 1a of the insulated base plate 1 if desired. Also, in the structure shown, the solder resist films 6 and 7 cover nearly all surfaces of the insulated base plate 1. However, the solder resist film may cover locally if desired e.g. high density circuit portions and/or portions about the through hole 4.

The above mentioned printed wiring board a solder resist film which itself has property of preventing wetting by flux or solder, and is effective to prevent bridging between adjacent circuits or terminals during the operations of soldering to mount electronic parts, or connection between circuit terminals on the printed wiring board. Thus, production accuracy is improved, bridge repair work is eliminated, and workability is improved.

However, the printed wiring board having the above mentioned silicon and/or fluorine series resin solder resist film has disadvantage such that when flux is applied to the solder resist film, some flux adheres on the solder resist film as stain dots so that production accuracy and external apearance is impaired.

Accordingly, the object of the present invention is to mitigate the above mentioned disadvantage of the printed wiring board having a solder resist film comprised of silicon and/or fluorine series resin, and to provide improved printed wiring board which effectively prevent stain dots of flux on the solder resist film from producing.

SUMMARY OF THE INVENTION

A printed wiring board includes an insulated dielectric base plate, a circuit pattern at least on one surface of the base plate, and a solder resist film containing silicon series and/or fluorine series resin and covering the base plate except a desired soldering area of the circuit pattern. The printed wiring board includes, according to the present invention, at least one flux accumulating means formed on the one surface of the base plate to accumulate flux repelled by the solder resist film.

Preferably, the flux accumulating means includes at least one flux accumulating recess formed on the one surface of the base plate and not covered by the solder resist film.

Preferably, the flux accumulating means includes at least one flux accumulating through-holes formed through the base plate.

The flux accumulating through hole may be formed concentric with the flux accumulating recess.

Preferably, the flux accumulating recess further includes a flux absorbing layer in the recess.

When the other surface of the insulated base plate also has the solder resist film, the lower edge of the through hole may simply pass through the solder resist film, or a concentric flux accumulating recess may be formed on the other surface.

As the flux accumulating means accumulates flux repelled by the silicon series and/or fluorine series resin contained in the solder resist film so that stain dots problem is solved and desired quality and accuracy are maintained.

DESCRIPTION OF THE PREFERRED EMBODIMENTS

Figure 2:
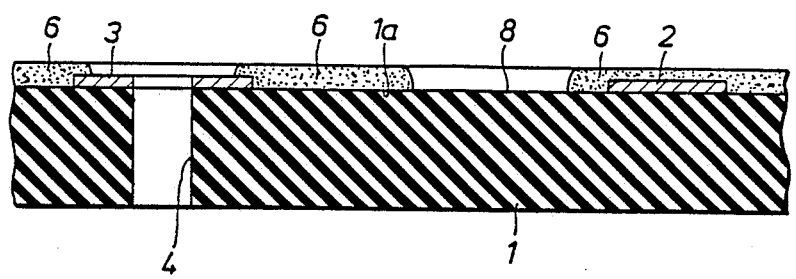
FIG. 2 is an enlarged sectional view of a portion of first embodiment of the printed wiring board, according to the present invention.

FIG. 2 is an enlarged sectional view of a portion of the first embodiment of the printed wiring board according to the present invention.

When a solder resist film 6 is formed by silk screen printing process on a circuit pattern 2 on an upper major surface 1a of an insulated dielectric base plate 1, a recess 8 to accumulate flux is formed adjacent to the solder resist film 6 on the major surface 1a but not on the circuit pattern 2 without being cover by the solder resist film 6 and with being bordered by an edge of the solder resist film 6.

The recess 8, according to the present invention, may be only one as the embodiment shown. Preferably, a plurality of recesses 8 are arranged in the film 6 to accumulate flux which is repelled by the repelling function of the film 6, to prevent stain dots of the flux on the surface 1a.

Figure 1:
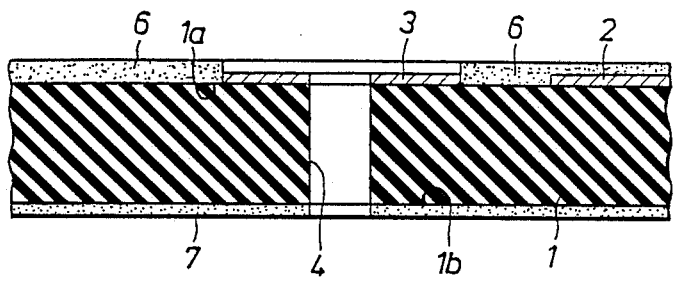
FIG. 1 is an enlarged sectional view of a portion of known printed wiring board.

Other construction is similar with the printed wiring board shown in FIG. 1 so that same reference numeral is used to represent same or similar part or portion.

The printed wiring board shown in FIG. 2 attains functional effect of the before mentioned printed wiring board shown in FIG. 1, and also has advantage such that the flux applied to the surface 1a of the insulated base plate 1 is repelled by the solder resist film 6 and is accumulated in the flux accumulation recess 8. Thus, the flux does not form stain dots on the solder resist film 6.

Accordingly, disadvantage of unevenness of the surface of the printed wiring board caused by stain dots of flux is eliminated, appearance of the printed wiring board is improved, and the desired printed wiring board having improved quality and accuracy is provided.

Figure 3:
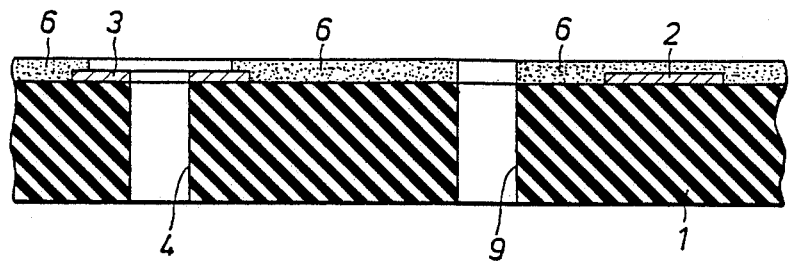
FIG. 3 is an enlarged sectional view of a portion of second embodiment of the printed wiring board.

FIG. 3 shows the second embodiment of the printed wiring board according to the present invention.

As shown in FIG. 3, a flux accumulating through-hole 9 is formed through the insulated base plate 1 at a desired position of the solder resist film 6.

A plurality of the through-hole 9 may be preferably formed in relation to the area of the solder resist film 6 to ensure the flow-out of the flux to stain dots on the solder resist film 6.

Figure 4:
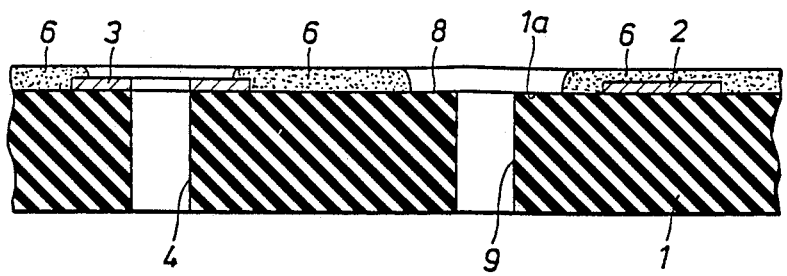
FIG. 4 is an enlarged sectional view of a portion of third embodiment of the printed wiring board.

FIG. 4 shows the third embodiment of the printed wiring board according to the present invention.

As shown in FIG. 4, a flux accumulating recess 8 is formed on the upper surface 1a of the insulated plate 1 without being covered by the solder resist ink film 6, and is similar with that shown in FIG. 2. Further, a flux accumulating through-hole 9 is formed concentric or in registration with the recess 8, and the through-hole 9 is similar with that shown in FIG. 3.

By combining the constructions shown in FIGS. 2 and 3, flux repelled from the surface of the solder resist film 6 is accumulated into the recess 8 and flows off from the through-hole 9.

Figure 5:
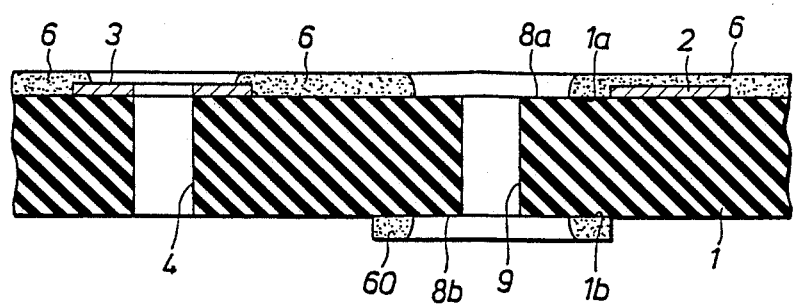
FIG. 5 is an enlarged sectional view of a portion of fourth embodiment of the printed wiring board.

FIG. 5 shows the fourth embodiment of the printed wiring board according to the present invention.

As shown in FIG. 5, the printed wiring board is finished in addition to the solder resist film 6 on the upper surface 1a of the insulated plate 1, with a solder resist film 60 preferably the same composition as the film 6, covers the rear surface 1b of the insulated plate 1.

According to the invention, a flux accumulating recess 8a is formed without being covered by the solder resist film 6, and a flux receiving through-hole 9 is formed concentric with the recess 8a generally similar with that shown in FIG. 4. Further, another flux accumulating recess 8b is formed the rear side surface 1b of the insulated plate 1, concentrically with the through hole 9, and without being covered by the solder resist film 60.

Thus, flux applied to the solder resist films 6 and 60 on both surfaces 1a and 1b of the insulated plate 1 is easily transferred to and accumulated in the recesses 8a and 8b and flows out the through-hole 9.

Figure 6:
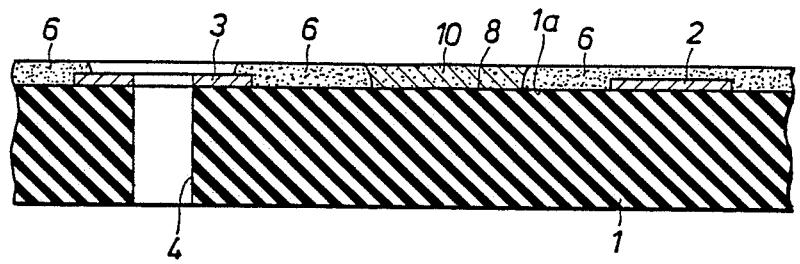
FIG. 6 is an enlarged sectional view of a portion of fifth embodiment of the printed wiring board.

FIG. 6 shows the fifth embodiment of the printed wiring board according to the present invention.

As shown in FIG. 6, a flux accumulating recess 8 is formed on the upper surface of the insulated plate 1 without being covered by the solder resist film 6 in generally similar manner with that shown in FIG. 2. Further, a flux absorbing layer 10 covers the recess 8. The flux absorbing layer 10 is preferably formed of painting carbon material.

The flux absorbing layer 10 positively absorbs flux so that flux repelled from the solder resist film 6 is easily and positively accumulated by the layer 10.

Figure 7:
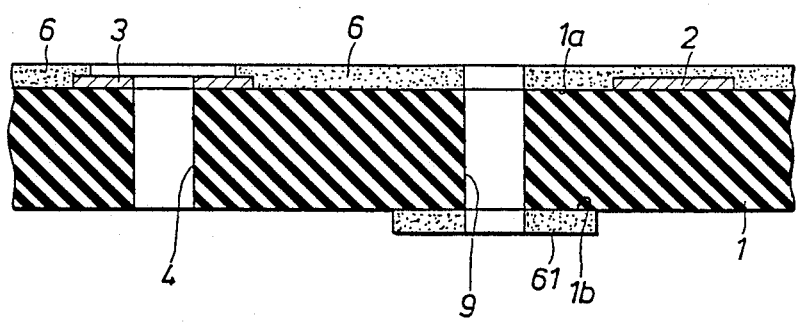
FIGS. 7, 8 and 9 are enlarged sectional views, respectively, of a portion of modification of the printed wiring board, according to the present invention.

FIG. 7 shows a modification of the printed wiring board according to the present invention.

As shown in FIG. 7, the printed wiring board has solder resist films 6 and 61 on both of the surfaces 1a and 1b of the insulated base plate 1. In this case, as shown in FIG. 3, a plurality of flux accumulating through-holes 9 are formed through the base plate 1 and solder resist films 6 and 61. The flux accumulating function of the through-hole 9 is similar with that described in FIG. 3.

Figure 8:
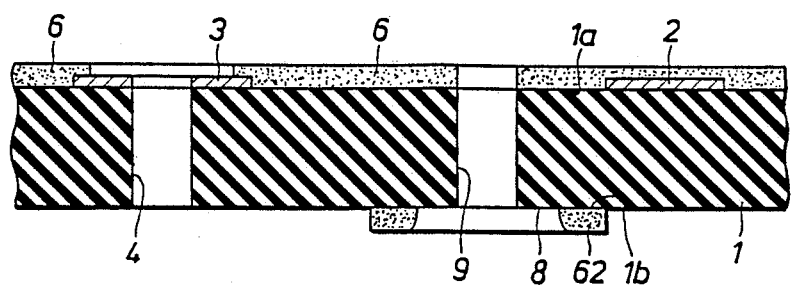

FIG. 8 shows another modification of the printed circuit board according to the present invention.

As shown in FIG. 8, the printed circuit board has solder resist films 6 and 62 on both surfaces 1a and 1b of the insulated base plate 1. In this case, at least one flux accumulating through-hole 9 is formed in the insulated plate 1 as described in FIG. 7. Further, in concentric relation with the flux accumulating through-hole 9, a flux accumulating recess 8 is formed on the other side surface 1b of the insulating plate 1 without being covered by the solder resist film 62. Flux accumulating function is improved as compared with that shown in FIG. 7, as the flux on the lower surface tends to spread. Also, the flux accumulating recess 8 can be formed as desired without considering the space of circuit pattern.

Figure 9:
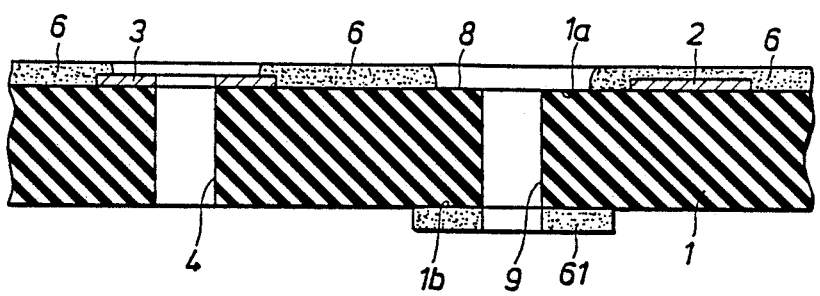

FIG. 9 shows further modification of the printed wiring board according to the present invention.

As shows in FIG. 9, the printed wiring board has solder resist films 6 and 61 on both surfaces 1a and 1b of the insulated plate 1, an includes at least one flux accumulating recess 8 without being covered by the solder resist film 6, and a flux accumulating through-hole 9 concentric with the recess 8 as shown in FIG. 4. The flux accumulating function is generally similar with that shown in FIG. 4.

The printed wiring board shown in FIGS. 2 to 9 attains functional effect of the before mentioned printed wiring board shown in FIG. 1, and also has advantage such that the flux applied to the surface 1a of the insulated base plate 1 is repelled by the solder resist film 6 and is accumulated in the flux accumulating recess 8 and/or flux accumulating through-hole 9. Thus, the flux does not form stain dots on the solder resist film 6.

Accordingly, disadvantage of unevenness of the surface of the printed wiring board caused by stain dots of flux is eliminated, appearance of the printed wiring board is improved, and the desired printed wiring board having improved quality and accuracy is provided.

We claim:

1. A printed wiring board including a dielectric base plate, a circuit pattern at least on one surface of the base plate, and a solder resist film containing silicon series resin and/or fluorine series resin and covering the base plate except a desired soldering area of the circuit pattern, the improvement comprising:

at least one flux accumulating means formed on the one surface of the base plate adjacent to the solder resist film to accumulate flux repelled by the solder resist film.

2. A printed wiring board as set forth in claim 1, wherein said at least one flux accumulating means includes at least one flux accumulating recess formed on said one surface of the base plate and not covered by said solder resist film.

3. A printed wiring board as set forth in claim 1, wherein said at least one flux accumulating means includes at least one flux accumulating through-hole formed through said base plate.

4. A printed wiring board as set forth in claim 2, wherein said at least one flux accumulating means further includes a flux accumulating through-hole formed through said base plate and concentric with said at least one flux accumulating recess.

5. A printed wiring board as set forth in claim 2, in which said at least one flux accumulating means further includes flux absorbing layer means covering said at least one flux accumulating recess.

6. A printed wiring board as set forth in claim 4, wherein said base plate has said solder resist film on both of the base plate surfaces, and said at least one flux accumulating means includes said at least one flux accumulating recess concentric with said through-hole and without being covered by said solder resist film.

7. A printed wiring board as set forth in claim 3, wherein said base plate has said solder resist film on both of the base plate surfaces, and said at least one flux accumulating through-hole passes through both of the solder resist film.

8. A printed wiring board as set forth in claim 3, wherein said base plate has said solder resist film on both of the base plate surfaces, and said at least one flux accumulating means further includes a flux accumulating recess concentric with said at least one flux accumulating through-hole and without being covered by said solder resist film.

9. A printed wiring board as set forth in claim 4, wherein said base plate has said solder resist film on both of the base plate surfaces, and said flux accumulating through-hole passes through the solder resist film on the other surface.

10. A printed wiring board as set forth in claim 1, wherein said at least one flux accumulating means includes at least two flux accumulating through-holes through said base plate and two flux accumulating recesses formed on said one surface without being covered by said solder resist film, one of the flux accumulating recesses formed on said one surface of the base plate being covered by a flux absorbing layer and the other flux accumulating recess formed on said one surface being concentric with one of the two flux accumulating through-holes.

11. A printed circuit board comprising: a dielectric base plate having a pair of opposed major surfaces; a circuit pattern disposed on at least one of the major surfaces; a solder resist film disposed on said one major surface to cover a predetermined area of the circuit pattern to repel flux and solder, the solder resist film containing silicon resin and/or fluorine resin effective to repel flux; and flux accumulating means formed adjacent to the solder resist film on said one major surface but not on the circuit pattern and in which flux repelled by the solder resist film accumulates.

12. A printed circuit board according to claim 11; wherein the flux accumulating means includes a flux accumulating recess bordered by an edge of the solder resist film.

13. A printed circuit board according to claim 12; including a flux absorbing layer disposed in the flux accumulating recess to absorb the repelled flux.

14. A printed circuit board according to claim 11; wherein the flux accumulating means includes a flux accumulating through-hole formed through the dielectric base plate.

15. A printed circuit board according to claim 14; including a pair of solder resist films disposed on both of the major surfaces such that the flux repelled by both of the solder resist films accumulates in the flux accumulating through-hole.

16. A printed circuit board according to claim 14; wherein the flux accumulating means includes a flux accumulating recess bordered by an edge of the solder resist film, and the flux accumulating through-hole is disposed in registration with the flux accumulating recess.

* * * * *